(12) United States Patent
Rostamzadeh et al.

(10) Patent No.: US 11,303,115 B2
(45) Date of Patent: Apr. 12, 2022

(54) ELECTROSTATIC DISCHARGE MITIGATION FOR DIFFERENTIAL SIGNAL CHANNELS

(71) Applicant: Robert Bosch GmbH, Stuttgart (DE)

(72) Inventors: Cyrous Rostamzadeh, Northville, MI (US); Chris Manross, Northville, MI (US); Micajah Worden, Linden, MI (US)

(73) Assignee: Robert Bosch GmbH, Stuttgart (DE)

( * ) Notice: Subject to any disclaimer, the term of this patent is extended or adjusted under 35 U.S.C. 154(b) by 375 days.

(21) Appl. No.: 16/593,510

(22) Filed: Oct. 4, 2019

(65) Prior Publication Data
US 2021/0104890 A1  Apr. 8, 2021

(51) Int. Cl.
*H05K 1/02* (2006.01)
*H02H 9/04* (2006.01)
*H01F 38/14* (2006.01)

(52) U.S. Cl.
CPC ............. *H02H 9/045* (2013.01); *H01F 38/14* (2013.01); *H05K 1/025* (2013.01); *H05K 1/0245* (2013.01); *H05K 2201/1003* (2013.01)

(58) Field of Classification Search
CPC ......... H05K 1/0259; H05K 2201/1003; H05K 1/025; H05K 1/0245
USPC .......................................................... 361/56
See application file for complete search history.

(56) References Cited

U.S. PATENT DOCUMENTS

| | | | |
|---|---|---|---|
| 5,995,353 A | 11/1999 | Cunningham et al. | |
| 7,035,072 B2 | 4/2006 | Colby | |
| 7,447,762 B2 | 11/2008 | Curray et al. | |
| 8,089,266 B2 | 1/2012 | Rostamzadeh et al. | |
| 9,197,423 B2 | 11/2015 | Crawley et al. | |
| 9,343,900 B2 | 5/2016 | Rostamzadeh et al. | |
| 9,438,031 B2 | 9/2016 | Besse et al. | |
| 9,640,525 B2 | 5/2017 | Hayashi | |
| 9,913,356 B2 | 3/2018 | Rostamzadeh et al. | |
| 2008/0037192 A1* | 2/2008 | Huang ............... | H01R 13/6658 361/118 |
| 2013/0293992 A1* | 11/2013 | Duwury ............... | H05K 1/0259 361/56 |

OTHER PUBLICATIONS

Bourns, "SM13072APEL—10/100 Base-T Transformer" Transformer Data Sheet, Jun. 8, 2011 (3 pages).
NXP, "PESD5VOU2BT Ultra low capacitance bidirectional double ESD protection diode" Product Data Sheet, Mar. 27, 2007 (11 pages).

* cited by examiner

*Primary Examiner* — Sherman Ng
(74) *Attorney, Agent, or Firm* — Michael Best & Friedrich LLP

(57) ABSTRACT

Interface circuits for differential signal channels. The interface circuit includes, for example, a transformer, a common mode choke, and a bidirectional transient voltage suppressor (TVS) diode. The transformer is coupled to two circuit side terminals of a differential signal channel. The common mode choke is coupled to the transformer. The common mode choke is also coupled to the two line side terminals of the differential signal channel via a first signal path and a second signal path. The bidirectional TVS diode includes a first output connection coupled to the first signal path. The bidirectional TVS diode also includes a second output connection coupled to the second signal path.

20 Claims, 9 Drawing Sheets

ELECTROSTATIC DISCHARGE MITIGATION FOR DIFFERENTIAL SIGNAL CHANNELS

BACKGROUND

Embodiments disclosed herein relate to electrostatic discharge (ESD) mitigation for differential signal channels. More specifically, the embodiments disclosed herein relate to electrostatic discharge mitigation for Ethernet differential signal channels.

Input/output electrostatic discharge compliance for 100BASE-TX signal channels in vehicle communication systems is challenging. For example, 100BASE-TX signal channels may be exposed to harmful electrostatic discharge pulses when an on-board diagnostic device (OBD) is connected to a vehicle's OBD connector for vehicle diagnostic purposes. An electrostatic discharge event can be caused, for example, due to a human body model (HBM) pulse and automotive electromagnetic compatibility (EMC) requirements mandate electrostatic discharge to exposed wires.

SUMMARY

Current electrostatic discharge mitigation solutions degrade signal quality and are unable to satisfy line impedance requirements. Accordingly, embodiments described herein provide, among other things, interface circuits for electrostatic discharge mitigation in differential signal channels.

For example, the disclosure provides an interface circuit for a differential signal channel. The differential signal channel includes a first circuit side terminal, a second circuit side terminal, a first connector side terminal, and a second connector side terminal. The interface circuit includes a transformer, a common mode choke, and a bidirectional transient voltage suppressor (TVS) diode. The transformer includes a first winding and a second winding. The first winding is coupled to the first circuit side terminal and to the second circuit side terminal. The common mode choke includes a third winding and a fourth winding. The third winding and the fourth winding are coupled to the second winding of the transformer. The third winding and the fourth winding are also coupled to the first line side terminal via a first signal path. The third winding and the fourth windings are also coupled to the second line side terminal via a second signal path. The bidirectional TVS diode includes a first output connection and a second output connection. The first output connection is coupled to the first signal path. The second output connection is coupled to the second signal path.

As a further example, the disclosure also provides an interface circuit for a transmitting differential signal channel and a receiving differential signal channel. The transmitting and receiving differential signal channels each include two circuit side terminals and two line side terminals. The interface circuit includes a first transformer, a first common mode choke, a first bidirectional TVS diode, a second transformer, a second common mode choke, and a second bidirectional TVS diode. The first transformer includes a first winding and a second winding. The first winding is coupled to the two circuit side terminals of the transmitting differential signal channel. The first common mode choke includes a third winding and a fourth winding. The third winding and the fourth winding are coupled to the second winding of the first transformer. The third winding and the fourth winding are also coupled to the two line side terminals of the transmitting differential signal channel. The first bidirectional TVS diode is coupled between the two line side terminals of the transmitting differential signal channel. The second transformer includes a fifth winding and a sixth winding. The fifth winding is coupled to the two circuit side terminals of the receiving differential signal channel. The second common mode choke includes a seventh winding and an eighth winding. The seventh winding and the eighth winding are coupled to the sixth winding of the second transformer. The seventh winding and the eighth winding are also coupled to the two line side terminals of the receiving differential signal channel. The second bidirectional TVS diode is coupled between the two line side terminals of the receiving differential signal channel.

Other aspects of the disclosure will become apparent by consideration of the detailed description and accompanying drawings.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments, and explain various principles and advantages of those embodiments.

Figure 1:
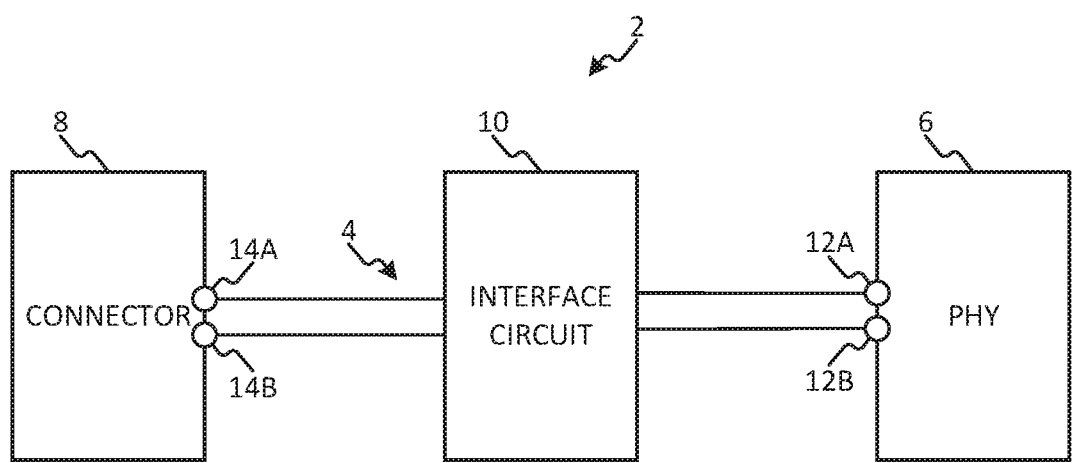
FIG. 1 is a block diagram of an example of a network configuration including a single differential signal channel, in accordance with some embodiments.

The apparatus and method components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

DETAILED DESCRIPTION

Current electrostatic discharge protection mechanisms include high frequency, low inductance multi-layer ceramic capacitors (MLCCs) or transient voltage suppressor (TVS) diodes with single-ended connections. However, current electrostatic discharge protection mechanisms are unsuitable for 100BASE-TX lines because these lines are designed as balanced 100 Ohm differential pairs to maintain high signal integrity, minimize radiated emission, and improve conducted and radiated radio-frequency (RF) immunity. Printed circuit board (PCB) balanced differential pair traces are designed carefully to meet length matching and trace geometry to meet 100 Ohm differential impedance requirements to interface, for example, with vehicle Ethernet Unshielded Twisted Pair Wires (UTWP). Current electrostatic discharge protection mechanisms are unable to meet these complex requirements and maintain high signal quality. For example, single-ended MLCC or TVS connections to differential traces degrade signal rise and fall times, and thus result in an EYE-diagram that fails to meet 100BASE-TX requirements. In addition, differential impedance is seriously impacted. In order to maintain high quality differential signals, PCB ground paths are etched out beyond an Ethernet magnetic component (for example, a transformer and a common mode choke). Current shunt suppression devices also require a ground connection path. Adding this ground connection path deviates from the norms of Ethernet layout practices. Further, current electrostatic discharge shunt protection devices result in significant common mode currents. The presence of any common mode current on cables is a major contributing factor to radiated emission non-conformance.

The embodiments described herein provide, among other things, interface circuits for differential signal channels. The described interface circuits mitigate electrostatic discharge, maintain high signal quality, and comply with line impedance requirements. Further, the described interface circuits include electrostatic protection devices that do not require a ground connection.

Figure 4:
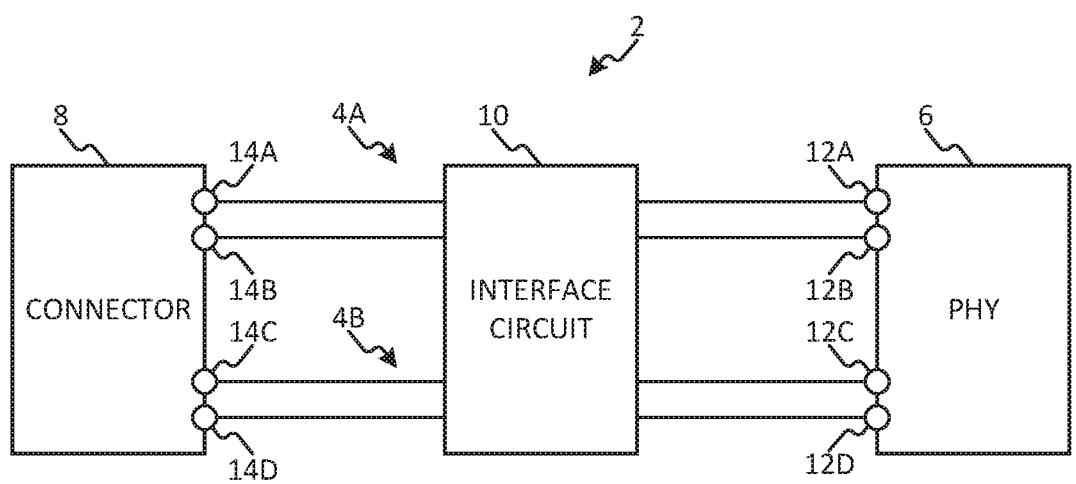
FIG. 4 is a block diagram of an example of a network configuration including dual differential signal channels, in accordance with some embodiments.

FIG. 1 is a block diagram of one example of an embodiment of a network configuration 2. The network configuration 2 illustrated in FIG. 1 includes a differential signal channel 4, a physical layer (i.e., PHY 6), a connector 8, and an interface circuit 10. For ease of description, although the network configuration 2 may understandably include more components (for example, amplifiers, resistors, capacitors, inductors, signal processing components, and so on), only those relevant in describing the invention are described in detail herein. In some embodiments, the network configuration 2 includes a single differential signal channel, as illustrated in FIG. 1. In alternate embodiments, the network configuration 2 includes more than one differential signal channel. For example, the network configuration 2 may include dual (i.e., two) differential signal channels, as illustrated in FIG. 4 and as will be described in more detail below in reference to FIG. 4. The differential signal channel 4 illustrated in FIG. 1 includes a differential pair of signal lines.

The PHY 6 is coupled to the differential pair of signal lines of the differential signal channel 4 via two terminals (i.e., circuit side terminal 12A and circuit side terminal 12B). The PHY 6 is an electronic circuit (for example, a chip) that is configured to implement physical layer functions of a telecommunication or computing system. The PHY 6 connects a link layer device (for example, a media access control) to a physical medium (for example, an optical fiber or a coper cable). In some embodiments, the PHY 6 includes an Ethernet PHY configured to implement the Ethernet physical layer portion of the 1000BASE-T, 100BASE-TX, and 10BASE-T standards. Alternatively or in addition, the PHY 6 includes a controller area network (CAN) PHY configured to implement the physical layer portion of the CAN bus standard. Alternatively or in addition, the PHY 6 includes a universal serial bus (USB) PHY configured to implement the physical layer portion of the USB standard.

The connector 8 is coupled to the differential pair of signal lines of the differential signal channel 4 via two terminals (i.e., line side terminal 14A and line side terminal 14B). The connector 8 includes one or more plugs and/or sockets for connecting to physical mediums (for example, optical fibers or coper cables). The connector 8 includes, for example, an RJ45 connector, a D-sub type connector, a USB connector, or a combination thereof.

The interface circuit 10 is coupled to the differential pair of signal lines of the differential signal channel 4. The interface circuit 10 is configured to provide isolation between the PHY 6 and a physical medium (for example, a network cable) connected to the connector 8. In addition, the interface circuit 10 is configured to provide electrostatic discharge protection on the differential pair of signal lines of the differential signal channel 4.

Figure 2:
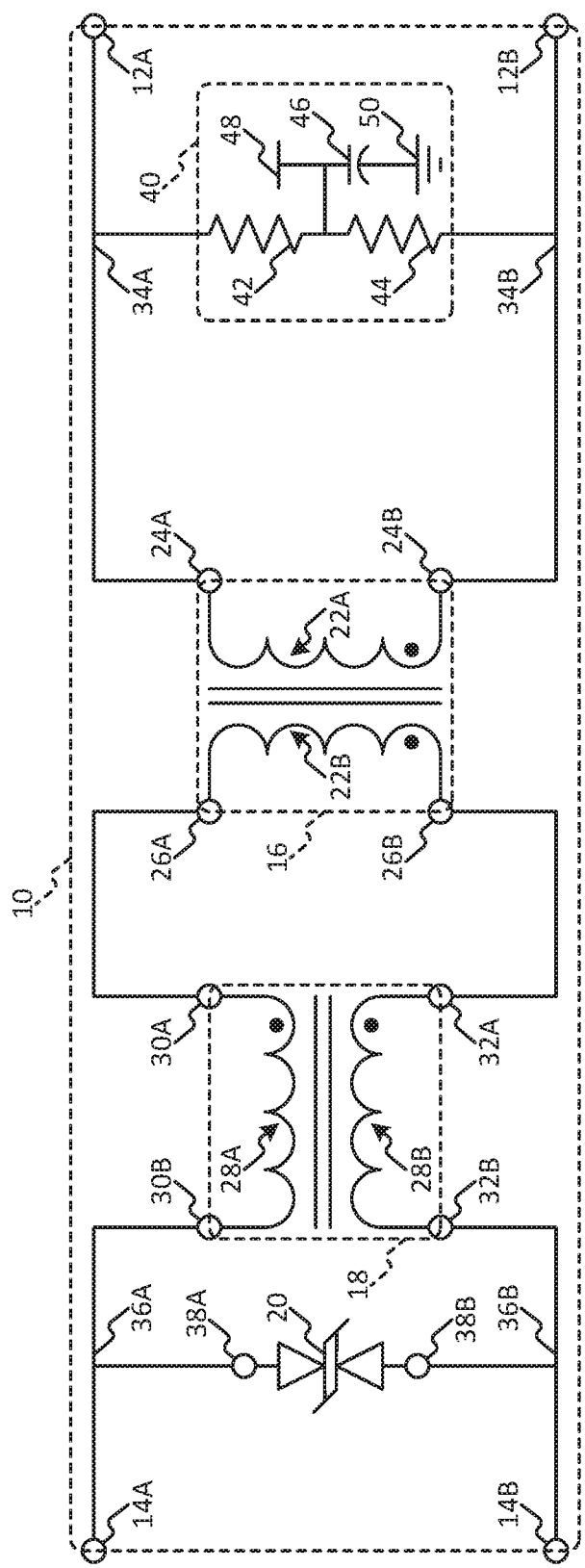
FIG. 2 is a block diagram of an example of an interface circuit with a non-center-tapped transformer for a single differential signal channel, in accordance with some embodiments.

FIG. 2 is a block diagram of one example of an embodiment of the interface circuit 10. The interface circuit 10 illustrated in FIG. 2 includes a transformer 16, a common mode choke 18, and a bidirectional transient voltage suppressor (TVS) diode 20. The combination of the transformer 16 and the common mode choke 18 is configured to provide isolation between the PHY 6 and a physical medium (for example, a network cable) connected to the connector 8. The bidirectional TVS diode 20 is configured to provide electrostatic discharge protection on the differential pair of signal lines of the differential signal channel 4.

Figure 3:
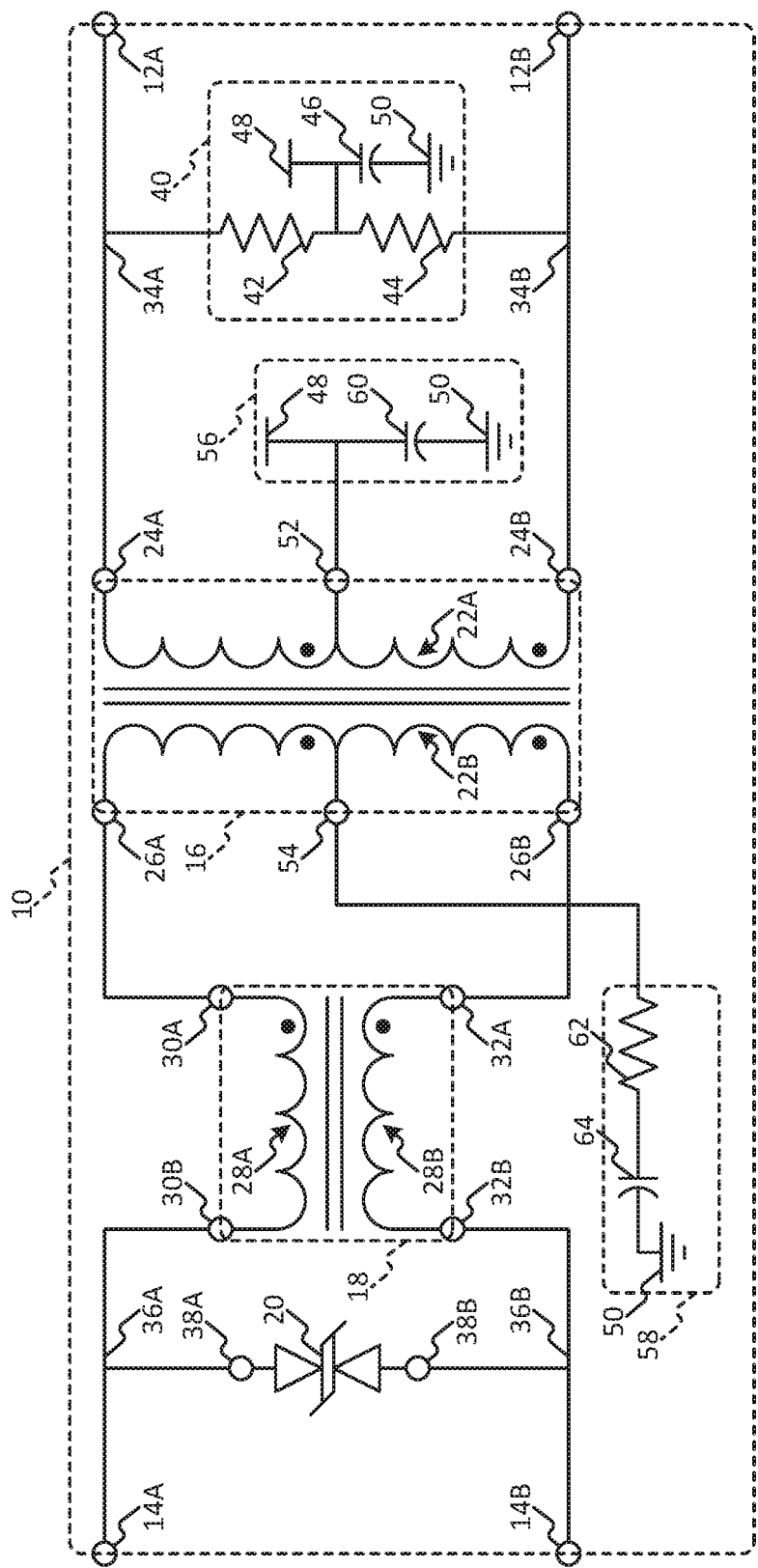
FIG. 3 is a block diagram of an example of an interface circuit with a center-tapped transformer for a single differential signal channel, in accordance with some embodiments.

The transformer 16 includes two windings. For example, as illustrated in FIG. 2, the transformer 16 includes windings 22A and 22B. In some embodiments, the transformer 16 is a non-center-tapped transformer and each winding of the transformer 16 includes two connections. For example, as illustrated in FIG. 2, winding 22A of the transformer 16 includes output connections 24A and 24B, and winding 22B of the transformer 16 includes output connections 26A and 26B. As illustrated in FIG. 3 and as will be described in more detail below in reference to FIG. 3, in alternate embodiments, the transformer 16 is a center-tapped transformer and each winding of the transformer 16 includes three connections. In some embodiments, the transformer 16 is an isolation transformer (i.e., the turn ratio between windings 22A and 22B is 1 to 1).

The common mode choke 18 includes two windings. For example, as illustrated in FIG. 2, the common mode choke 18 includes windings 28A and 28B. Each winding of the common mode choke 18 include two connections. For example, as illustrated in FIG. 2, winding 28A of the common mode choke 18 includes output connections 30A and 30B, and winding 28B of the common mode choke 18 includes output connections 32A and 32B.

One winding of the transformer 16 is coupled to the circuit side terminals 12A and 12B via a pair of signal paths. For example, as illustrated in FIG. 2, output connection 24A of the transformer 16 is coupled to circuit side terminal 12A via circuit side signal path 34A, and output connection 24B of the transformer 16 is coupled to circuit side terminal 12B via circuit side signal path 34B. The other winding of the transformer 16 is coupled to one end of each windings of the common mode choke 18. For example, as illustrated in FIG. 2, output connection 26A of winding 22B of the transformer 16 is coupled to output connection 30A of winding 28A of the common mode choke 18, and output connection 26B of winding 22B of the transformer 16 is coupled to output connection 32A of winding 28B of the common mode choke 18. The other ends of each winding of the common mode choke 18 are coupled to the line side terminals 14A and 14B via a pair of signal paths. For example, as illustrated in FIG. 2, output connection 30B of winding 28A of the common mode choke 18 is coupled to line side terminal 14A via line side signal path 36A, and output connection 32B of winding 28B of the common mode choke 18 is coupled to line side terminal 14B via line side signal path 36B.

Bidirectional TVS diode 20 has an ultra-low capacitance. In some embodiments, the capacitance of bidirectional TVS diode 20 is less than 3 picofarads. For example, the capacitance of bidirectional TVS diode 20 may be approximately 2.9 picofarads. Bidirectional TVS diode 20 includes a pair of serially coupled avalanche diodes. Bidirectional TVS diode 20 also includes two connections. For example, as illustrated in FIG. 2, bidirectional TVS diode 20 includes output connections 38A and 38B. Bidirectional TVS diode 20 is coupled as a differential component between line side signal paths 36A and 36B. For example, as illustrated in FIG. 2, output connection 38A of bidirectional TVS diode 20 is coupled to line side signal path 36A, and output connection 38B of bidirectional TVS diode 20 is coupled to line side signal path 36B.

In some embodiments, the circuit side signal paths 34A and 34B are coupled to a termination network 40, as illustrated in FIG. 2. The termination network 40 illustrated in FIG. 2 includes a pair of resistors 42 and 44, and a capacitor 46. One end of each of the resistors 42 and 44 are coupled in series with each other. The other ends of each of the resistors 42 and 44 are respectively coupled to one of the circuit side signal paths 34A and 34B. The capacitor 46 is coupled between a power terminal 48 (for example, a +3.3 Volt power rail for the PHY 6) and a reference terminal 50 (for example, a ground terminal). The capacitor 46 is also coupled to the connection between the pair of resistors 42 and 44.

FIG. 3 is a block diagram of another example of an embodiment of the interface circuit 10. The transformer 16 illustrated in FIG. 3 is a center-tapped transformer and each winding of the transformer 16 includes three connections. For example, as illustrated in FIG. 3, winding 22A of the transformer 16 includes output connections 24A and 24B and center tap connection 52, and winding 22B of the transformer 16 includes output connections 26A and 26B and center tap connection 54. In some embodiments, the center tap connections 52 and 54 of the transformer 16 are coupled to termination networks. For example, as illustrated in FIG. 3, center tap connection 52 of winding 22A of the transformer 16 is coupled to termination network 56, and center tap connection 54 of winding 22B of the transformer 16 is coupled to termination network 58. The termination network 56 illustrated in FIG. 3 includes a capacitor 60. One end of the capacitor 60 is coupled to the center tap connection 52 and to the power terminal 48. The other end of the capacitor 60 is coupled to the reference terminal 50. The termination network 58 illustrated in FIG. 3 includes a resistor 62 and a capacitor 64 coupled in series with each other between the center tap connection 54 and the reference terminal 50.

Current electrostatic discharge protection mechanisms including coupling the line side terminals to ground (for exampling, coupling line side terminal 14A to reference terminal 50 via a diode). While coupling line side terminals to ground shunts current to ground, it does not control or limit the voltage across, for example, transformer 16. Not limiting the voltage across transformer 16 can result in high voltages, and therefore result in damaging injections of current into the power supply through power terminal 48 and into sensitive device connected at the circuit side terminals 12A and 12B.

Bidirectional TVS diode 20 conducts in the event of an electrostatic discharge at line side terminal 14A or at line side terminal 14B. The voltage potential between the line side terminals 14A and 14B is defined as the forward voltage drop of the forward conducting diode in bidirectional TVS diode 20 plus the reverse breakdown voltage of the reverse conducting diode in bidirectional TVS diode 20. Bidirectional TVS diode 20 maintains the line side terminals 14A and 14B in a Common Mode configuration (i.e., the differential voltage across the line side terminals 14A and 14B remains zero or very low at all times). Thus, while the amplitudes of the voltages may be very high on both line side terminals 14A and 14B during an electrostatic discharge, the majority of this high voltage is common on both sides. The common high voltages on both sides acts like an offset with only a small differential voltage between output connections 30B and 32B that gets translated to output connections 24A and 24B. In other words, the interface circuit 10 does not dissipate the energy of electrostatic discharges to the reference terminal 50, but rather blocks the translation of the energy from reaching output connections 24A and 24B. There is zero conduction current from line side terminal 14A (or from line side terminal 14B) to the reference terminal 50, which reduces the differential electrostatic discharge voltage across the circuit side terminals 12A and 12B to low levels.

When an electrostatic discharge is applied to the line side terminal 14A, an electrostatic discharge current path is defined as line side terminal 14A to line side signal path 36A to output connection 38A to output connection 36B (through bidirectional TVS diode 20) to line side signal path 36B to output connection 32B to output connection 32A (through winding 28B) to output connection 26B to center tap connection 54 (through winding 22B) to reference terminal 50 (through resistor 62 and capacitor 64). Thus, current from an electrostatic discharge is dissipated through resistor 62 and capacitor 64 to the reference terminal 50.

FIG. 4 is a block diagram of another example of an embodiment of the network configuration 2. The network configuration 2 illustrated in FIG. 4 includes dual differential signal channels (i.e., a transmitting differential signal channel 4A and a receiving differential signal channel 4B), PHY 6, connector 8, and interface circuit 10. Each of the transmitting differential signal channel 4A and the receiving differential signal channel 4B includes a differential pair of signal lines. The PHY 6 is coupled to the differential pair of signal lines of the transmitting differential signal channel 4A via two terminals (i.e., circuit side terminal 12A and circuit side terminal 12B). Further, the PHY 6 is coupled to the differential pair of signal lines of the receiving differential signal channel 4B via two terminals (i.e., circuit side terminal 12C and circuit side terminal 12D). The connector 8 is coupled to the differential pair of signal lines of the transmitting differential signal channel 4A via two terminals (i.e., line side terminal 14A and line side terminal 14B). Further, the connector 8 is coupled to the differential pair of signal lines of the receiving differential signal channel 4B via two terminals (i.e., line side terminal 14C and line side terminal 14D). The interface circuit 10 is coupled to both differential pairs of signal lines of the transmitting differential signal channel 4A and the receiving differential signal channel 4B.

Figure 5:
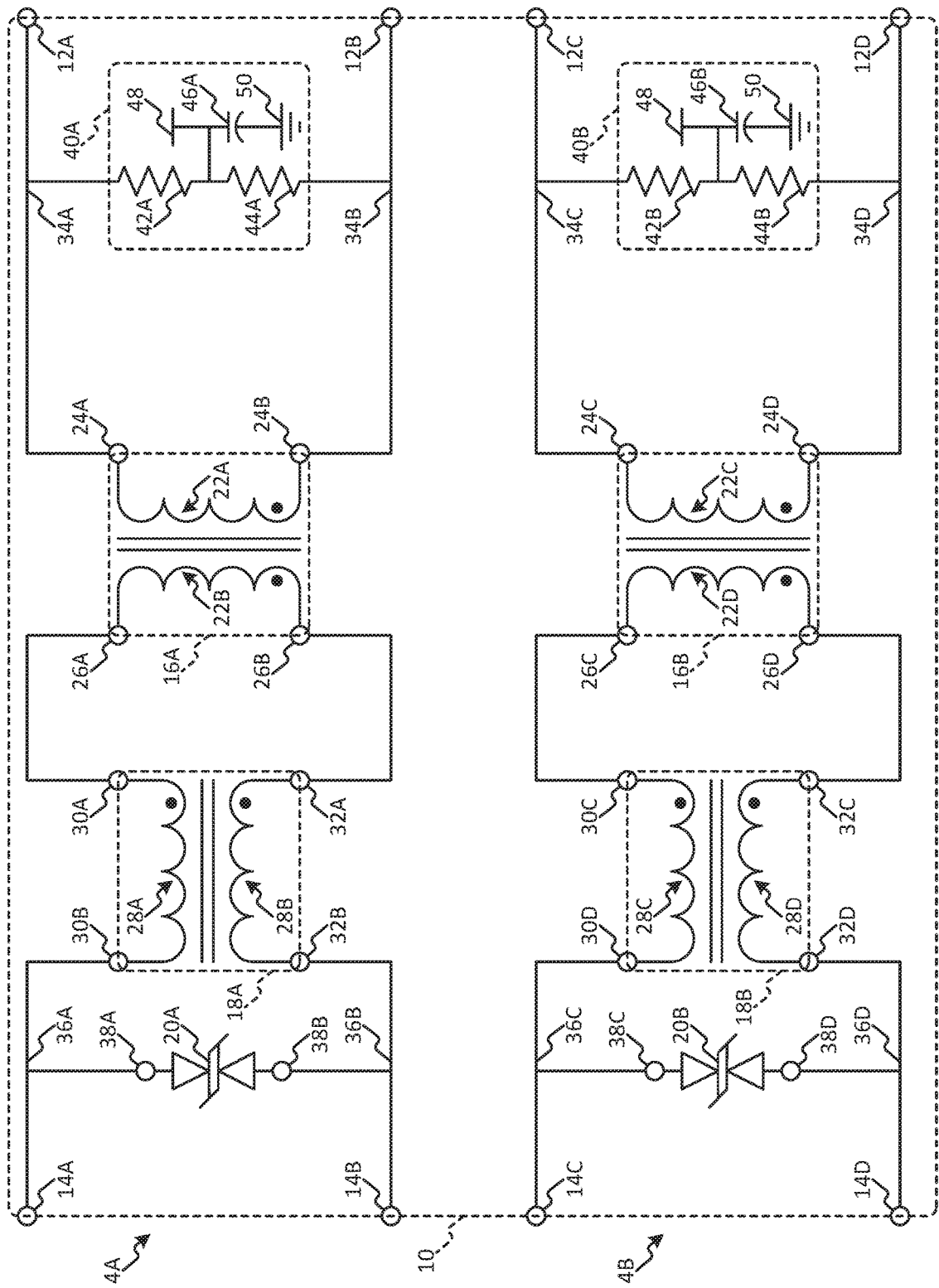
FIG. 5 is a block diagram of an example of an interface circuit with a non-center-tapped transformer for dual differential signal channels, in accordance with some embodiments.

FIG. 5 is a block diagram of one example of an embodiment of the interface circuit 10. For the transmitting differential signal channel 4A, the interface circuit 10 includes a transformer 16A, a common mode choke 18A, and a bidirectional TVS diode 20A, as illustrated in FIG. 5. Further, the receiving differential signal channel 4B, the interface circuit 10 includes a transformer 16B, a common mode choke 18B, and a bidirectional TVS diode 20B, as illustrated in FIG. 5.

Figure 6:
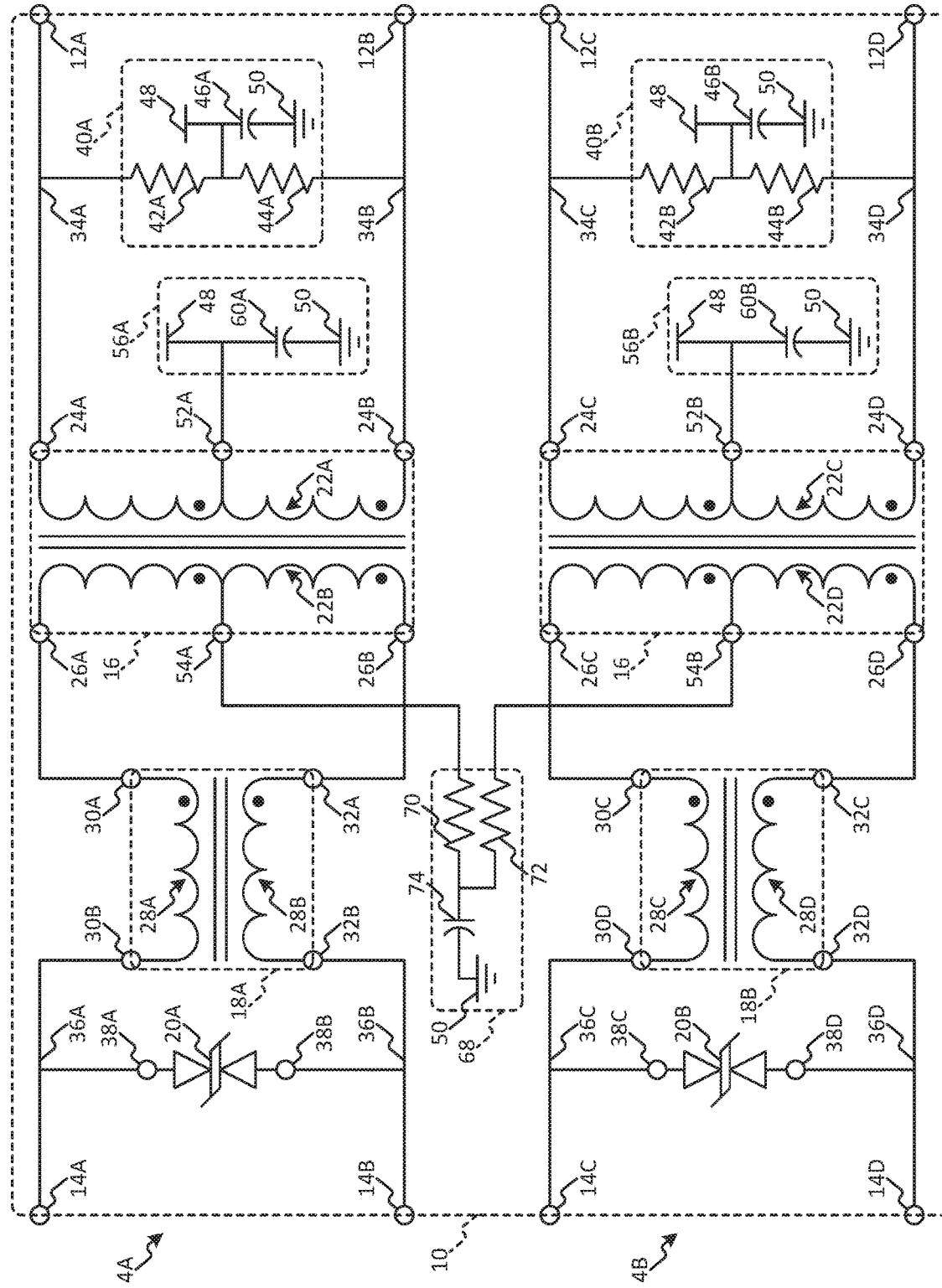
FIG. 6 is a block diagram of an example of an interface circuit with a center-tapped transformer for dual differential signal channels, in accordance with some embodiments.

The transformers 16A and 16B each include two windings. For example, as illustrated in FIG. 5, transformer 16A includes windings 22A and 22B, and transformer 16B includes windings 22C and 22D. In some embodiments, the transformers 16A and 16B are non-center-tapped transformers and each winding of the transformers 16A and 16B include two connections. For example, as illustrated in FIG. 5, winding 22A of transformer 16A includes output connections 24A and 24B, winding 22C of transformer 16B includes output connections 24C and 24D, winding 22B of transformer 16A includes output connections 26A and 26B, and winding 22D of transformer 16B includes output connections 26C and 26D. As illustrated in FIG. 6 and as will be described in more detail below in reference to FIG. 6, in alternate embodiments, the transformers 16A and 16B are a center-tapped transformers and each winding of the transformers 16A and 16B includes three connections. In some embodiments, the transformers 16A and 16B are isolation transformers (i.e., the turn ratio between windings 22A and 22B is 1 to 1, and the turn ratio between winding 22C and 22D is also 1 to 1).

The common mode chokes 18A and 18B each include two windings. For example, as illustrated in FIG. 5, the common mode choke 18A includes windings 28A and 28B, and the common mode choke 18B includes windings 28C and 28D. Each winding of the common mode chokes 18A and 18B includes two connection. For example, as illustrated in FIG. 5, winding 28A of the common mode choke 18A includes output connections 30A and 30B, winding 28C of the common mode choke 18B includes output connections 30C and 30D, winding 28B of the common mode choke 18A includes output connections 32A and 32B, and winding 28D of the common mode choke 18B includes output connections 32C and 32D.

One winding of the transformer 16A for the transmitting differential signal channel 4A is coupled to the circuit side terminals 12A and 12B via a pair of signal paths. For example, as illustrated in FIG. 5, output connection 24A of the transformer 16A is coupled to circuit side terminal 12A via circuit side signal path 34A, and output connection 24B of the transformer 16A is coupled to circuit side terminal 12B via circuit side signal path 34B. The other winding of the transformer 16A is coupled to one end of each windings of the common mode choke 18A. For example, as illustrated in FIG. 5, output connection 26A of winding 22B of the transformer 16A is coupled to output connection 30A of winding 28A of the common mode choke 18A, and output connection 26B of winding 22B of the transformer 16A is coupled to output connection 32A of winding 28B of the common mode choke 18A. The other ends of each winding of the common mode choke 18A are coupled to the line side terminals 14A and 14B of the transmitting differential signal channel 4A via a pair of signal paths. For example, as illustrated in FIG. 5, output connection 30B of winding 28A of the common mode choke 18A is coupled to line side terminal 14A via line side signal path 36A, and output connection 32B of winding 28B of the common mode choke 18A is coupled to line side terminal 14B via line side signal path 36B.

One winding of the transformer 16B for the receiving differential signal channel 4B is coupled to the circuit side terminals 12C and 12D via a pair of signal paths. For example, as illustrated in FIG. 5, output connection 24C of the transformer 16B is coupled to circuit side terminal 12C via circuit side signal path 34C, and output connection 24D of the transformer 16B is coupled to circuit side terminal 12D via circuit side signal path 34D. The other winding of the transformer 16B is coupled to one end of each windings of the common mode choke 18A. For example, as illustrated in FIG. 5, output connection 26C of winding 22D of the transformer 16B is coupled to output connection 30C of winding 28C of the common mode choke 18A, and output connection 26D of winding 22D of the transformer 16B is coupled to output connection 32C of winding 28D of the common mode choke 18B. The other ends of each winding of the common mode choke 18B are coupled to the line side terminals 14C and 14D of the receiving differential signal channel 4B via a pair of signal paths. For example, as illustrated in FIG. 5, output connection 30D of winding 28C of the common mode choke 18B is coupled to line side terminal 14C via line side signal path 36C, and output connection 32D of winding 28D of the common mode choke 18B is coupled to line side terminal 14D via line side signal path 36D.

The bidirectional TVS diodes 20A and 20B each have ultra-low capacitances. In some embodiments, the capacitances of the bidirectional TVS diodes 20A and 20B are less than 3 picofarads. For example, the capacitances of the bidirectional TVS diodes 20A and 20B may be approximately 2.9 picofarads. Each of the bidirectional TVS diodes 20A and 20B include a pair of serially coupled avalanche diodes. Each of the bidirectional TVS diodes 20A and 20B also include two connections. For example, as illustrated in FIG. 5, bidirectional TVS diode 20A includes output connections 38A and 38B, and bidirectional TVS diode 20B includes output connections 38C and 38D.

Bidirectional TVS diode 20A for the transmitting differential signal channel 4A is coupled as a differential component between line side signal paths 36A and 36B. For example, as illustrated in FIG. 5, output connection 38A of bidirectional TVS diode 20A is coupled to line side signal path 36A, and output connection 38B of bidirectional TVS diode 20A is coupled to line side signal path 36B. Bidirectional TVS diode 20B for the receiving differential signal channel 4B is coupled as a differential component between line side signal paths 36C and 36D. For example, as illustrated in FIG. 5, output connection 38C of bidirectional TVS diode 20B is coupled to line side signal path 36C, and output connection 38D of bidirectional TVS diode 20B is coupled to line side signal path 36D.

In some embodiments, the circuit side signal paths 34A and 34B for the transmitting differential signal channel 4A are coupled to a termination network 40A, and the circuit side signal paths 34C and 34D for the receiving differential signal channel 4B are coupled to a termination network 40B, as illustrated in FIG. 5. The termination network 40A illustrated in FIG. 5 includes a pair of resistors 42A and 44A, and a capacitor 46A. One end of each of the resistors 42A and 44A are coupled in series with each other. The other ends of each of the resistors 42A and 44A are respectively coupled to one of the circuit side signal paths 34A and 34B for the transmitting differential signal channel 4A. The capacitor 46A is coupled between a power terminal 48 (for example, a +3.3 Volt power rail for the PHY 6) and a reference terminal 50 (for example, a ground terminal). The capacitor 46A is also coupled to the connection between the pair of resistors 42A and 44A. The termination network 40B illustrated in FIG. 5 includes a pair of resistors 42B and 44B, and a capacitor 46B. One end of each of the resistors 42B and 44B are coupled in series with each other. The other ends of each of the resistors 42B and 44B are respectively coupled to one of the circuit side signal paths 34C and 34D for the receiving differential signal channel 4B. The capacitor 46B is coupled between the power terminal 48 and the reference terminal 50. The capacitor 46B is also coupled to the connection between the pair of resistors 42B and 44B.

FIG. 6 is a block diagram of another example of an embodiment of the interface circuit 10. The transformers 16A and 16B illustrated in FIG. 6 are center-tapped transformers and each winding of the transformers 16A and 16B includes three connections. For example, as illustrated in FIG. 6, winding 22A of the transformer 16A includes output connections 24A and 24B and center tap connection 52A, winding 22C of the transformer 16B includes output connections 24C and 24D and center tap connection 52B, winding 22B of the transformer 16A includes output connections 26A and 26B and center tap connection 54A, and winding 22D of the transformer 16B includes output connections 26C and 26D and center tap connection 54B. In some embodiments, the center tap connections 52A, 52B, 54A, and 54B of the transformers 16A and 16B are coupled to termination networks. For example, as illustrated in FIG. 6, center tap connection 52A of winding 22A of the transformer 16A is coupled to termination network 56A, and center tap connection 52B of winding 22C of the transformer 16B is coupled to termination network 56B. Further, as illustrated in FIG. 6, center tap connection 54A of winding 22B of the transformer 16A and center tap connection 54B of winding 22D of the transformer 16B are both coupled to termination network 68. Termination network 56A illustrated in FIG. 6 includes a capacitor 60A. One end of the capacitor 60A is coupled to the center tap connection 52A and to the power terminal 48. The other end of the capacitor 60A is coupled to the reference terminal 50. Termination network 56B illustrated in FIG. 6 includes a capacitor 60B. One end of the capacitor 60B is coupled to the center tap connection 52B and to the power terminal 48. The other end of the capacitor 60B is coupled to the reference terminal 50.

The termination network 68 illustrated in FIG. 6 includes a pair of resistors 70 and 72, and a capacitor 74. One end of each of the resistors 70 and 72 are coupled in series with each other. The other ends of each of the resistors 70 and 72 are respectively coupled to the center tap connections 54A and 54B of the transformers 16A and 16B. For example, as illustrated in FIG. 6, the other end of resistor 70 is coupled to center tap connection 54A of winding 22B of the transformer 16A, and the other end of resistor 72 is coupled to center tap connection 54B of winding 22D of the transformer 16B. One end of the capacitor 74 is coupled to the connection between the pair of resistors 70 and 72. The other end of the capacitor 74 is coupled to the reference terminal 50.

Figure 7:
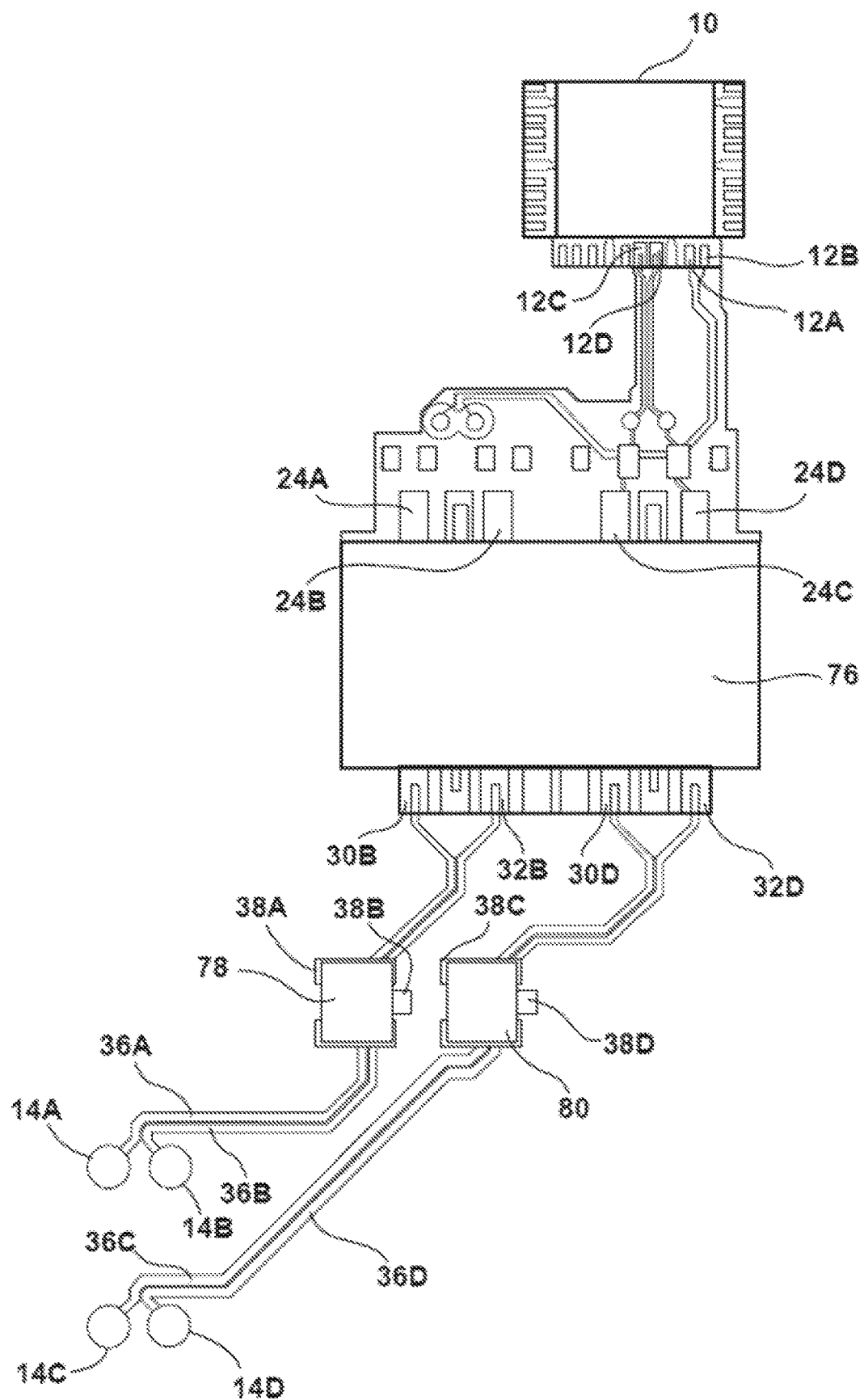
FIG. 7 is diagram of an example of a printed circuit board layout including an interface circuit, in accordance with some embodiments.

FIG. 7 is diagram of an example of a printed circuit board layout including the interface circuit 10, in accordance with some embodiments. In some embodiments, as illustrated in FIG. 7, the transformers 16A and 16B and the common mode chokes 18A and 18B are enclosed within a housing (i.e., chip 76). In some embodiments, chip 76 includes an SM13072APEL 10/100 Base-T Transformer by Bourns®. In some embodiments, as illustrated in FIG. 7, bidirectional TVS diode 20A is enclosed within a housing (i.e., chip 78), and bidirectional TVS diode 20B is enclosed within another housing (i.e., chip 80). In some embodiments, chip 78, chip 80, or both include an ultra-low capacitance bidirectional double ESD protection diode (for example, the PESD5VOU2BT double ESD protection diode by NXP©). The PESD5VOU2BT double ESD protection diode includes two bidirectional TVS diodes. In some embodiments, one of the two bidirectional TVS diodes included in the PESD5VOU2BT double ESD protection diode is used as bidirectional TVS diode 20A (or bidirectional TVS diode 20B) and the other bidirectional TVS diode is not used. In such embodiments, the dedicated output terminal for the unused bidirectional TVS diode in the PESD5VOU2BT double ESD protection diode is floating (i.e., not coupled to either of the line side signal paths 36A or 36B).

Figure 8:
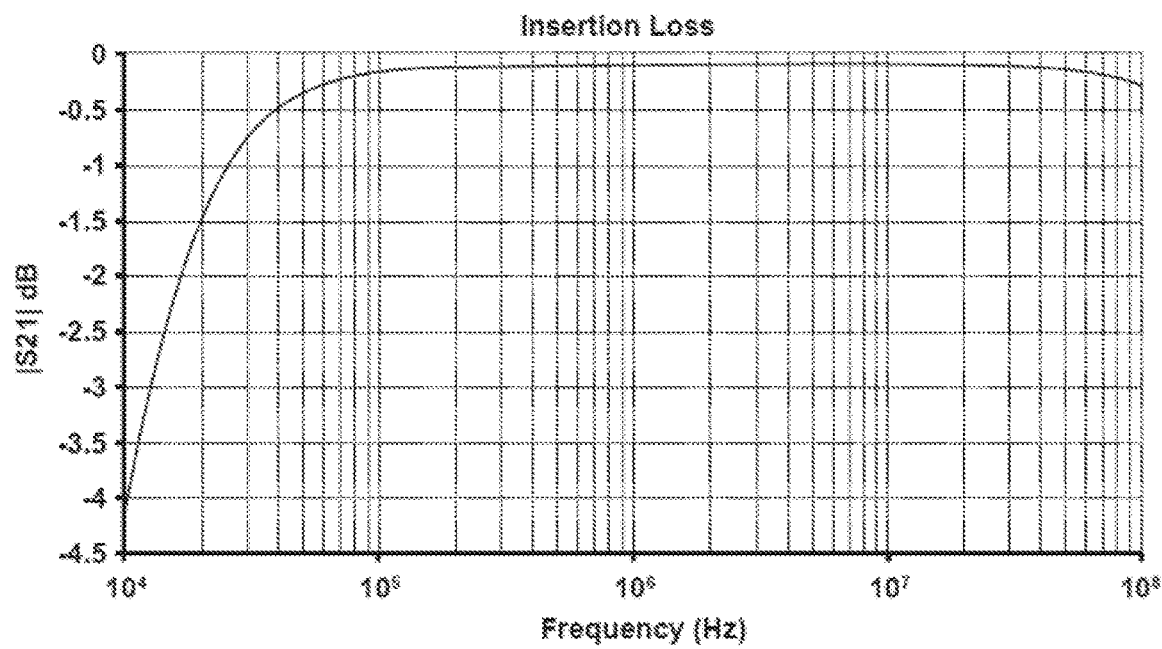
FIG. 8 is a graph of an example insertion loss of a transformer and a common mode choke, in accordance with some embodiments.
Figure 9:
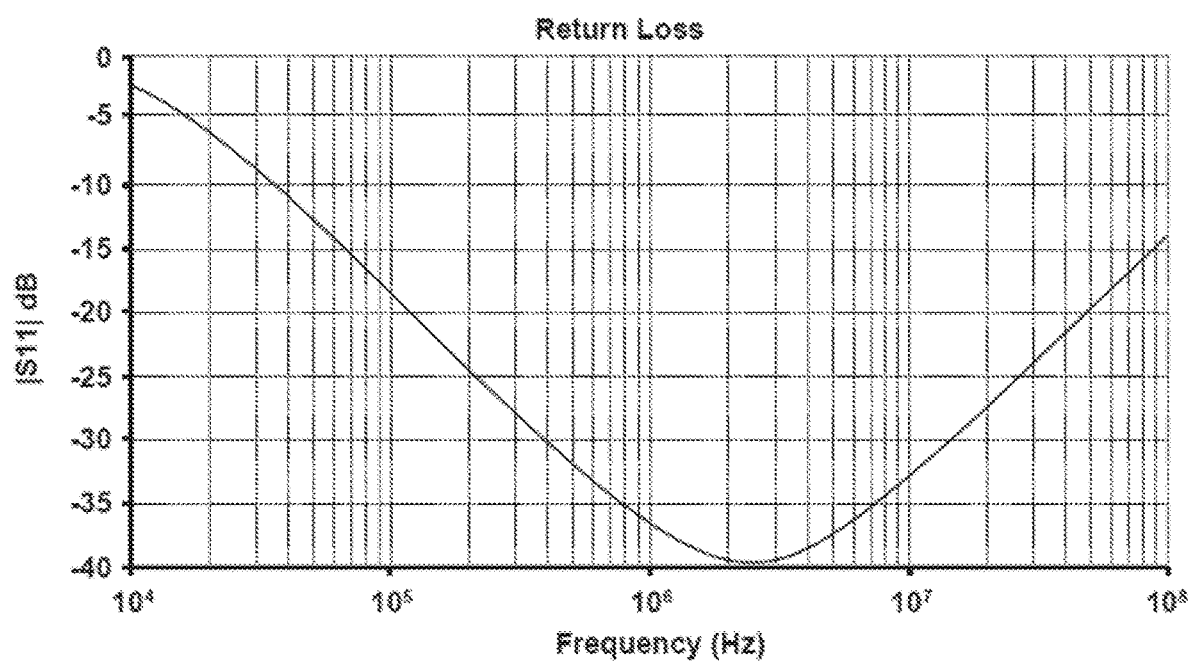
FIG. 9 is a graph of an example return loss of a transformer and a common mode choke, in accordance with some embodiments.

FIG. 8 is a graph of an example insertion loss of the transformer 16 and the common mode choke 18 (for example, included in chip 76). Insertion loss is the loss of signal power resulting from the insertion of the transformer 16 and the common mode choke 18. As illustrated in FIG. 8, the insertion loss of the transformer 16 and the common mode choke 18 is very small for higher frequencies (for example, frequencies from 100 KHz to hundreds of MHz). Due to the low insertion loss, high frequencies waveforms are easily translated across the transformer 16 and the common mode choke 18. FIG. 9 is a graph of an example return loss of the transformer 16 and the common mode choke 18 (for example, included in chip 76). Return loss is the loss of power in the signal returned (or reflected) by a discontinuity in a transmission line. As illustrated in FIG. 9, the return loss of the transformer 16 and the common mode choke 18 is very small for higher frequencies.

Figure 10:
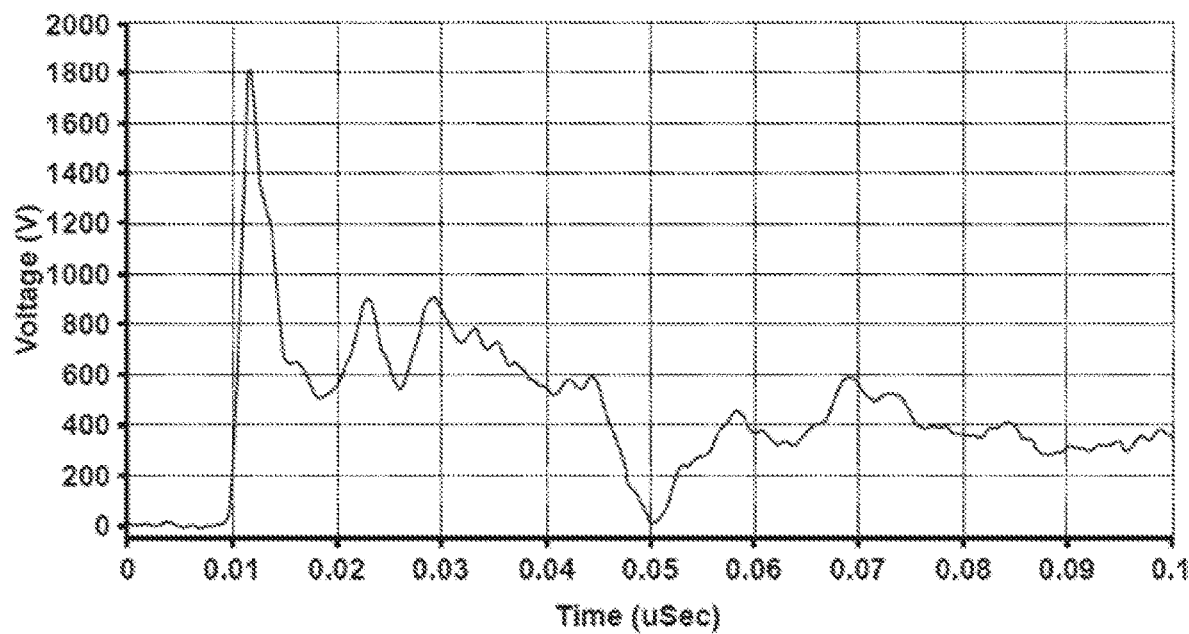
FIG. 10 is graph of an electrostatic discharge waveform applied to the interface circuit of FIG. 3.
Figure 11:
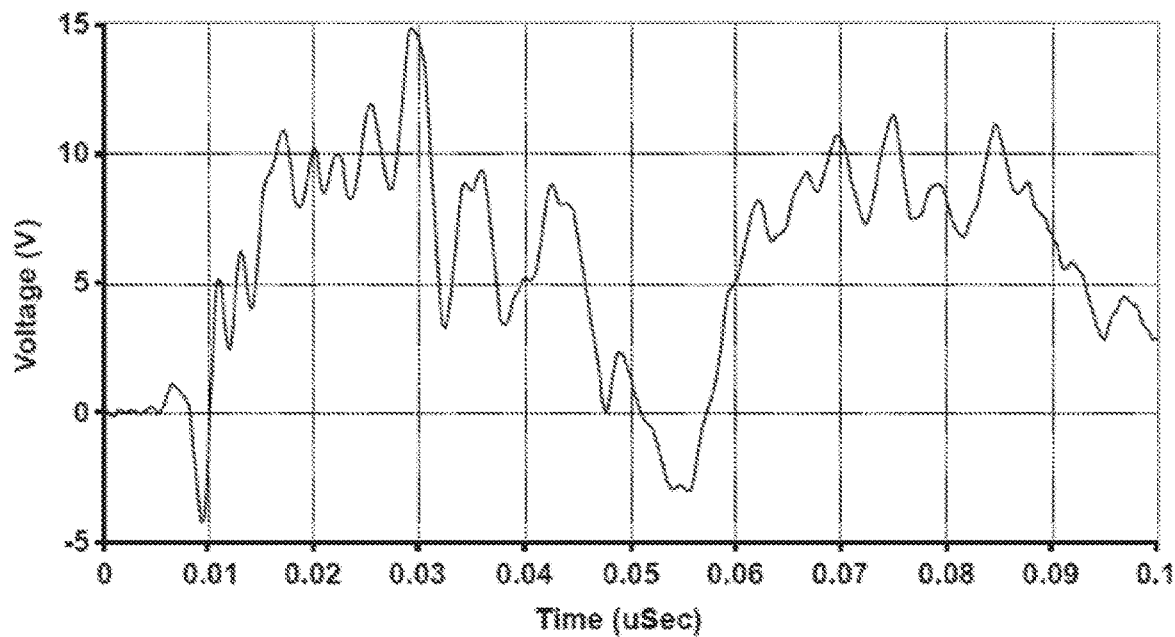
FIG. 11 is a graph of a differential voltage measured within the interface circuit of FIG. 3 while the electrostatic discharge waveform of FIG. 10 is applied.

FIG. 10 includes a graph of an electrostatic discharge waveform measured at line side terminal 14A relative to the reference terminal 50. In FIG. 10, a 15 kilovolt electrostatic discharge occurs at line side terminal 14A and the voltage is measured at line side terminal 14A relative to the reference terminal 50. The loading on the line results in a voltage of about 1.8 kilovolts. The voltage relative to the reference terminal 50 is very high on winding 22B of the transformer 16 and bidirectional TVS diode 20A does not lower this voltage. FIG. 11 includes a graph of a differential voltage measured between the two line side terminals 14A and 14B (i.e., the voltage of line side terminal 14A minus the voltage of line side terminal 14B). The differential voltage in FIG. 11 is measured while the electrostatic discharge waveform of FIG. 10 is applied to line side terminal 14A. As illustrated in FIG. 11, the differential voltage peaks at about 50 volts, which is significantly lower the 1.8 kilovolt peak of the electrostatic discharge waveform. As described previously herein, the lower voltage peak in FIG. 11 is caused by bidirectional TVS diode 20 converting the differential voltage of the electrostatic discharge to a common mode voltage that acts almost equally to each end of winding 22B of the transformer 16.

In addition to lowering the voltage peaks of electrostatic discharges, the interface circuit 10 satisfies industry standard signal integrity (SI) requirements for 100BASE-TX lines that are measurable with an EYE-diagram. Measured EYE-diagrams of the interface circuit 10 verify that: (i) signals do not impose into the mask area; (ii) EYE height and width are within acceptable ranges; (iii) there are no overshoots or undershoots; and (iv) the cross-over point is symmetrical (i.e., rise and fall times are not degraded).

Thus, the disclosure provides, among other things, systems for mitigating electrostatic discharge in differential signal lines. Various features and advantages are set forth in the following claims.

In the foregoing specification, specific embodiments have been described. However, one of ordinary skill in the art appreciates that various modifications and changes may be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An interface circuit for a differential signal channel having first and second circuit side terminals and first and second line side terminals, the interface circuit comprising:
   a transformer including
      a first winding coupled to the first and the second circuit side terminals, and
      a second winding;
   a common mode choke including third and fourth windings coupled
      to the second winding of the transformer,
      to the first line side terminal via a first signal path, and
      to the second line side terminal via a second signal path; and
   a bidirectional transient voltage suppressor (TVS) diode including
      a first output connection coupled to the first signal path, and
      a second output connection coupled to the second signal path.

2. The interface circuit of claim 1, wherein the bidirectional TVS diode is not coupled to a reference terminal.

3. The interface circuit of claim 1, wherein the transformer is an isolation transformer.

4. The interface circuit of claim 1, wherein capacitance of the bidirectional TVS diode is less than three picofarads.

5. The interface circuit of claim 1, further comprising a termination network coupled between the first and the second circuit side terminals.

6. The interface circuit of claim 1, wherein the transformer is a center-tapped transformer, and wherein the first and the second windings of the transformer each including a center tap connection.

7. The interface circuit of claim 6, further comprising
   a first termination network coupled to the center tap connection of the first winding of the transformer; and
   a second termination network coupled to the center tap connection of the second winding of the transformer.

8. The interface circuit of claim 1, wherein the differential signal channel includes a pair of 100BASE_TX differential signal lines.

9. The interface circuit of claim 8, wherein the first and the second circuit side terminals are coupled to an Ethernet physical layer (PHY).

10. The interface circuit of claim 9, wherein the first and the second line side terminals are coupled to an RJ45 connector.

11. An interface circuit for a transmitting differential signal channel and a receiving differential signal channel, each including two circuit side terminals and two line side terminals, the interface circuit comprising:
   a first transformer including
      a first winding coupled to the two circuit side terminals of the transmitting differential signal channel, and
      a second winding;
   a first common mode choke including third and fourth windings coupled to the second winding of the first transformer and to the two line side terminals of the transmitting differential signal channel;
   a first bidirectional transient voltage suppressor (TVS) diode coupled between the two line side terminals of the transmitting differential signal channel;
   a second transformer including
      a fifth winding coupled to the two circuit side terminals of the receiving differential signal channel, and
      a sixth winding;

a second common mode choke including seventh and eighth windings coupled to the sixth winding of the second transformer and to the two line side terminals of the receiving differential signal channel; and a second bidirectional TVS diode coupled between the two line side terminals of the receiving differential signal channel.

12. The interface circuit of claim 11, wherein the first and the second bidirectional TVS diodes are not coupled to a reference terminal.

13. The interface circuit of claim 11, wherein the first and the second transformers are isolation transformers.

14. The interface circuit of claim 11, wherein capacitances of the first and the second bidirectional TVS diodes are each less than three picofarads.

15. The interface circuit of claim 11, further comprising
a first termination network coupled between the two circuit side terminals of the transmitting differential signal channel; and
a second termination network coupled between the two circuit side terminals of the receiving differential signal channel.

16. The interface circuit of claim 11, wherein the first and the second transformers are each center-tapped transformers, wherein the first winding of the first transformer includes a first center tap connection, wherein the second winding of the first transformer includes a second center tap connection, wherein the first winding of the second transformer includes a third center tap connection, and wherein the second winding of the second transformer includes a fourth center tap connection.

17. The interface circuit of claim 16, further comprising
a first termination network coupled to the first center tap connection;
a second termination network coupled to the second center tap connection; and
a third termination network coupled to the third center tap connection and to the fourth center tap connection.

18. The interface circuit of claim 11, wherein the transmitting and receiving differential signal channels each include a pair of 100BASE_TX differential signal lines.

19. The interface circuit of claim 18, wherein the two circuit side terminals of the transmitting differential signal channel are coupled to an Ethernet physical layer (PHY), and wherein the two circuit side terminals of the receiving differential signal channel are coupled to the Ethernet PHY.

20. The interface circuit of claim 19, wherein the two line side terminals of the transmitting differential signal channel are coupled to an RJ45 connector, and wherein the two line side terminals of the receiving differential signal channel are coupled to the RJ45 connector.

* * * * *